US008673678B2

(12) United States Patent
Niesen et al.

(10) Patent No.: US 8,673,678 B2
(45) Date of Patent: Mar. 18, 2014

(54) PROCESS OF MAKING A THIN-FILM PHOTOVOLTAIC DEVICE AND THIN-FILM PHOTOVOLTAIC DEVICE

(75) Inventors: Thomas Niesen, Deisenhofen (DE); Volker Probst, Berlin (DE)

(73) Assignee: Saint-Gobain Glass France (FR)

( * ) Notice: Subject to any disclaimer, the term of this patent is extended or adjusted under 35 U.S.C. 154(b) by 790 days.

(21) Appl. No.: 12/097,913

(22) PCT Filed: Dec. 19, 2006

(86) PCT No.: PCT/EP2006/069879
§ 371 (c)(1),
(2), (4) Date: Oct. 15, 2008

(87) PCT Pub. No.: WO2007/071663
PCT Pub. Date: Jun. 28, 2007

(65) Prior Publication Data
US 2009/0223556 A1      Sep. 10, 2009

(30) Foreign Application Priority Data

Dec. 21, 2005  (EP) ..................................... 05112605

(51) Int. Cl.
*H01L 21/00* (2006.01)
*H01L 31/00* (2006.01)
(52) U.S. Cl.
USPC .. 438/85; 136/255; 257/E21.09; 257/E31.015
(58) Field of Classification Search
USPC ......... 136/255; 438/85; 257/E21.09, E31.015
See application file for complete search history.

(56) References Cited

U.S. PATENT DOCUMENTS

| 4,216,411 | A | 8/1980 | Ehret et al. ..................... 315/118 |
| 5,626,688 | A | 5/1997 | Probst et al. ................... 136/265 |
| 5,871,630 | A | 2/1999 | Bhattacharya et al. ....... 205/192 |
| 6,913,943 | B2 * | 7/2005 | Cunningham et al. .......... 438/57 |

FOREIGN PATENT DOCUMENTS

| DE | 4440878 | 7/1996 | .......... H01L 31/0392 |
| EP | 604801 | 7/1994 | .......... H01L 31/0336 |
| WO | WO9736334 | 10/1997 | ............ H01L 31/048 |

OTHER PUBLICATIONS

Bhattacharya, Raghu N. et al., "18.5% Copper Indium Gallium Diselenide (CIGS) Device Using Single-Layer, Chemical-Bath-Deposited ZnS(O,OH)", Oct. 2004, Japanese Journal of Applied Physics, vol. 43, No. 11B, pp. 1475-1476.*

Bar, M, et al: "High efficiency chalcopyrite solar cells with ILGAR-ZnO WEL-device characteristics subject to the WEL composition", Conference Record of the 29th IEEE Photovoltaic Specialists Conference, vol. CONF. 29, May 19, 2002.

(Continued)

*Primary Examiner* — Tamir Ayad
(74) *Attorney, Agent, or Firm* — Steinfl & Bruno, LLP

(57) ABSTRACT

A thin-film photovoltaic device and a process of making such a device, the device comprising a first layer of a chalkopyrite semiconductor of a first doping type; a second layer of intrinsic zinc oxide deposited by chemical vapor deposition; a third layer of zinc oxide semiconductor of a second doping type opposite to the first doping type and deposited by a method other than chemical vapor deposition; and wherein the second layer is arranged between the first and third layers.

25 Claims, 1 Drawing Sheet

(56) References Cited

OTHER PUBLICATIONS

Chichibu, S, et al: "Greenish-white electroluminescence from p-type CuGaS2 heterojunction diodes using n-type ZnO as an electron injector", Applied Physics Letters, AIP, American Institute of Physics, Melville, NY, US, vol. 85, No. 19, Nov. 8, 2004, pp. 4403-4405.

Palm, J, et al: Second generation CIS solar modules, Solar Energy, vol. 77, pp. 757-765, 2004.

Nakada, T, et al: "18% Efficiency Cd-Free Cu(In, Ga)Se2 thin-film solar cells fabricated using chemical bath deposition (CBC)-ZnS buffer layers", Jpn. J. Appl. Phys. vol. 41, pp. L165-L167, 2002.

Ennaoui, A, et al: "Highly efficient Cu(Ga,In)(S, Se)2 thin film solar cells with zinc-compound buffer layers", Thin Solid Films 431-432, pp. 335-339, 2003.

Plazer-Björkman, et al., "Atomic layer deposition of Zn(O,S) buffer layers for high efficiency Cu (In,Ga) Se2 solar cells", ChProc. $3^{rd}$ World Conference on Photovoltaic Energy Conversion, Osaka, Japan, 2003.

Bhattacharya, R.N., et al: "Cu(In,Ga)Se2 thin film solar cells with buffer layer alternative to CdS", Solar Energy 77, pp. 679-683, 2004.

Kushiya, K.: "Development of Cu(InGa)Se2-based thin-film PV modules with a Zn(O,S,OH) x buffer layer", Solar Energy 77, pp. 717-724, 2004.

PCT International Search Report issued for PCT Application No. PCT/EP2006/069879 filed on Dec. 19, 2006 in the name of Shell Erneurerbare Energien GmbH.

PCT Written Opinion issued for PCT Application No. PCT/EP2006/069879 filed on Dec. 19, 2006 in the name of Shell Erneurerbare Energien GmbH.

PCT International Preliminary Report on Patentability issued for PCT Application No. PCT/EP2006/069879 filed on Dec. 19, 2006 in the name of Shell Erneurerbare Energien GmbH.

Baosheng Sang, et al., Performance improvement of CGIS-based modules by depositing high-quality Ga-doped ZnO windows with magnetron sputtering, Solar Energy Materials & Solar Cells 2001, 67: 237-245.

\* cited by examiner

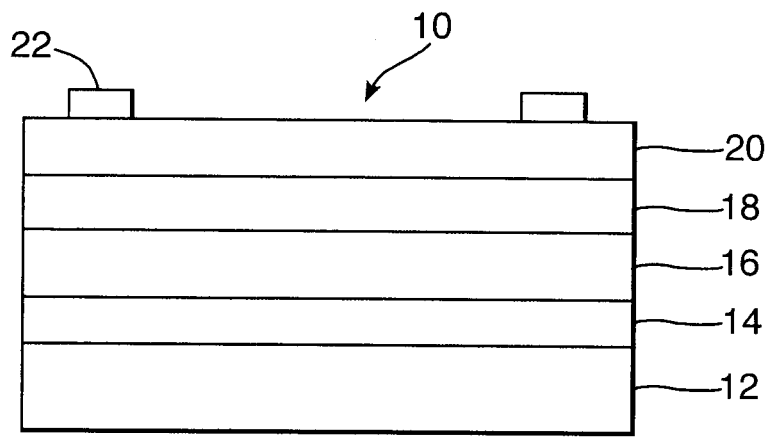
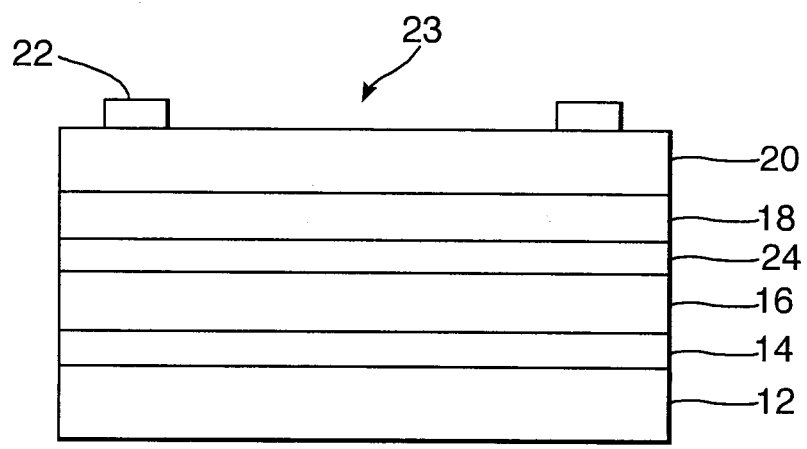

PROCESS OF MAKING A THIN-FILM PHOTOVOLTAIC DEVICE AND THIN-FILM PHOTOVOLTAIC DEVICE

PRIORITY CLAIM

The present application claims priority of European Patent Application No. 05112605.0 filed 21 Dec. 2005.

FIELD OF THE INVENTION

The invention relates to a process of making a thin-film photovoltaic device and to a thin-film photovoltaic device obtainable by that process.

BACKGROUND OF THE INVENTION

A particular class of thin-film photovoltaic devices has an absorber layer formed of a group I-III-VI semiconductor, also referred to as a chalkopyrite semiconductor. Such a semiconductor is generally of the copper indium diselenide ("CIS") type, wherein this expression is to be understood such that indium can be partly or fully replaced by gallium and/or aluminium, and selenium can be partly or fully replaced by sulphur. CIS type semiconductors include those characterized by the formula $CuIn_xGa_yAl_{(1-x-y)}Se_zS_{(2-z)}$, wherein $x+y \leq 1$ and $z \leq 2$. Special cases of a CIS type layer are e.g. also denoted as CIGS or CIGSS. The CIS type layer can further comprise a low concentration, trace, or a doping concentration of one or more further elements or compounds, in particular alkali such as sodium, potassium, rubidium, cesium, and/or francium, or alkali compounds. The concentration of such further constituents is typically 5 wt % or less, preferably 3 wt % or less.

The CIS type layer is typically arranged on a back electrode of a metal film such as Mo which is supported by a substrate, typically soda-lime glass, but other substrates are possible as well. Preferably a diffusion barrier layer such as of silicon nitride or silicon oxide is arranged between the glass substrate and the back electrode.

The thin-film photovoltaic device is typically completed by depositing a buffer layer of cadmium sulphide on the CIS type layer, followed by one or more layers of a transparent metal oxide, often zinc oxide on which metal contacts are arranged. The top layer of the metal oxide is arranged to be an n-type semiconductor, e.g. by doping ZnO with boron or aluminium.

In the manufacture of photovoltaic devices such as solar cells and solar modules, it is desired to optimise a number of parameters such as efficiency, open circuit voltage, short circuit current, fill factor, and at the same time one wishes to fulfill certain requirements like long-term stability and resistance to environmental influences such as temperature and moisture. A further goal is to minimize or eliminate the use of cadmium.

U.S. Pat. No. 4,612,411 discloses a thin-film photovoltaic device comprising subsequently a layer of p-type copper indium diselenide semiconductor; a layer of high-resistivity zinc oxide, and a layer of low-resistivity zinc oxide, wherein both zinc oxide layers are deposited by chemical vapour deposition ("CVD"). No buffer layer of CdS is present. The high-resistivity zinc oxide can further comprise sulphur. In a CVD process, the substrate is exposed to a chemically reactive vapour composition, wherein the reaction taking place on the substrate surface produces the desired deposit as a film. Although good electrical performance can be achieved with such a cell, it has been reported in International Patent Application publication No. WO97/36334 that modules with CVD deposited zinc oxide show relatively large degradation in a so-called damp-heat test, and that this problem can be solved by arranging a further barrier layer on top of the ZnO.

European patent application publication No. EP 0 604 801 A2 discloses a thin film photovoltaic device comprising a semiconductor film onto which an insulating zinc oxide film has been chemically deposited from solution, and thereupon a CVD n-type zinc oxide.

In a presently preferred process as it is described in J. Palm, V. Probst and F. H. Karg, "Second generation CIS solar modules" Solar Energy, vol. 77, p. 757-765, 2004, a CdS buffer layer is employed, onto which a thin layer (ca. 75 nm) of intrinsic ZnO is deposited by RF magnetron sputtering from a ceramic ZnO target. Subsequently, a 600-800 nm thick n-type ZnO layer is deposited by DC magnetron sputtering from a $ZnO-Al_2O_3$ target. U.S. Pat. No. 5,871,630 discloses another process in which a CdS layer is deposited, followed by RF sputtering of two zinc oxide layers.

Another deposition method is discussed in the article "High efficiency chalkopyrite solar cells with ILGAR-ZnO WEL-device characteristics subject to the WEL composition, M. Bär et al., Conference record of the $29^{th}$ IEEE Photovoltaics specialists conference, vol 29, 10 May 2002. ZnO is deposited using Ion Layer Gas Reaction (ILGAR), which method includes first dipping the substrate in a $Zn^{2+}$ precursor solution, drying, and chemical conversion of the solid precursor in a gaseous atmosphere.

Research has been conducted to find alternatives for CdS for use as buffer layer on top of a CIS type absorber layer. German patent specification DE 44 40 878 C1 discloses a CIS type thin film solar cell with a cadmium free buffer layer including a ternary compound of a metal component, sulphur, and oxygen, wherein the metal component is indium or tin, and with a ZnO window layer on top. The articles "Performance improvement of CIGS based modules by depositing high-quality Ga-doped ZnO windows with magnetron sputtering", Baosheng Sang et al., Solar Energy Materials & Solar Cells 67 (2001) 237-245; "18% Efficiency Cd-free Cu(In,Ga)$Se_2$ thin-film solar cells using chemical bath deposition (CBD)-ZnS buffer layers", Tokio Nakada et al., Jpn. J. Appl. Phys. Vol 41 (2002) pp L165-L167; "Highly efficient Cu(Ga, In)$(S,Se)_2$ thin film solar cells with zinc-compound buffer layers", A. Ennaoui et al.; Thin Solid Films 431-432 (2003) 335-339; "Atomic layer deposition of Zn(O,S) buffer layers for high efficiency Cu(In,Ga)$Se_2$ solar cells", Ch. Plazer-Björkman et al., Proc. 3rd World Conference on Photovoltaic Energy Conversion, Osaka, Japan, 2003; Cu(In,Ga)Se2 thin film solar cells with buffer layer alternative to CdS", R. N. Bhattacharya et al., Solar Energy 77 (2004) 679-683 disclose various such alternative materials including Ga-doped ZnO, ZnS, Zn(O,S), ZnS(O,OH) for buffer layers interposed between the CIS type layer and one or more sputtered ZnO window layers.

The article "Development of Cu(In, Ga)$Se_2$-based thin-film PV modules with a Zn(O,S,OH)$_x$ buffer layer", Katsumi Kushiya, Solar Energy 77 (2004) 717-724, discloses a Zn(O, S,OH)$_x$ buffer layer deposited by chemical bath deposition between a Cu(In,Ga)$Se_2$ layer and a boron doped zinc oxide window layer deposited by metal organic chemical vapor deposition.

It is an object of the present invention to provide a photovoltaic device based on a CIS type absorber layer of improved performance.

It is a further object to provide a method for manufacturing such a device.

SUMMARY OF THE INVENTION

The invention provides a process of making a thin-film photovoltaic device comprising the steps of a) providing a first layer of a chalkopyrite semiconductor of a first doping type;
b) after step a), depositing a second layer of intrinsic zinc oxide by chemical vapour deposition; and
c) after step b), depositing a third layer of n-type zinc oxide semiconductor of a second doping type opposite to the first doping type by a method other than chemical vapour deposition.

The invention moreover provides a thin-film photovoltaic device obtainable by the process of the invention and comprising
a first layer of a chalkopyrite semiconductor of a first doping type;
a second layer of intrinsic zinc oxide deposited by chemical vapour deposition;
a third layer of zinc oxide semiconductor of a second doping type opposite to the first doping type and deposited by a method other than chemical vapour deposition;
and wherein the second layer is arranged between the first and third layers.

Applicant has found that the combination of a layer of intrinsic zinc oxide deposited by chemical vapour deposition and a doped zinc oxide semiconductor layer deposited in another way provides an improved performance photovoltaic module in that good electrical properties are achieved at the same time as good resistance to damp-heat.

The expression 'first doping type' or 'second doping type' with reference to a semiconductor layer is used to refer to either a n-type or a p-type doped layer.

The third layer can for example be deposited by spray pyrolysis, molecular beam epitaxy (MBE), a Sol-Gel process, vacuum plasma arc evaporation, electrodeposition.

Preferably, the third layer is sputter deposited ZnO, more preferably ZnO deposited by a DC sputtering process. Sputter deposition and other non-chemical processes are preferred.

In an advantageous embodiment the third layer is deposited by sputtering, preferably DC sputtering.

Applicant has realized that CVD deposited ZnO is less compact than other ZnO, and regards this as the major cause for limited damp heat stability. In particular sputter deposited ZnO is believed to be more compact and to have a different microstructure, and it is believed that therefore the damp-heat stability is increased.

In a particular embodiment the process can further comprise the step a1) between steps a) and b), of providing a fourth layer. The device then further comprises between the first and second layers a fourth layer. The fourth layer can in particular be a buffer layer.

The fourth layer is different from the first and second layers and can be of CdS, but preferably the fourth layer is free of cadmium. In particular the fourth layer can comprise a cadmium free metal such as Zn, In, Sn, and oxygen and/or sulphur. More preferably the fourth layer comprises a cadmium free metal, oxygen and sulphur. In a particularly advantageous form the layer contains part or substantially all of the oxygen in hydroxyl groups. An example is a layer of Zn(S,O,OH). This notation is used to refer to a layer consisting substantially of Zn, S, O, OH. This layer can be a mixture of substantially ZnO, ZnS, Zn(OH)$_2$, as described by Kushiya in Solar Energy 77 (2004) 717-724 as Zn(O,S,OH)$_x$ buffer layer. Other suitable layers can be formed from In$_2$S$_3$, ZnSe, and/or SnO$_2$, wherein again depending on the deposition method a quantity of hydroxyl groups can be included. The fourth layer, in particular Zn(S,O,OH), can be provided by chemical bath deposition.

In another embodiment the second layer is in overlaying contact with the first layer, so that no additional buffer layer is arranged.

Suitably the third layer is in overlaying contact with the second layer.

BRIEF DESCRIPTION OF THE DRAWINGS

The invention will now be described in more detail and with reference to the accompanying drawings, wherein
FIG. 1 shows schematically a first embodiment of a photovoltaic device according to the invention; and
FIG. 2 shows schematically a second embodiment of a photovoltaic device according to the invention.

Where like reference numerals are used in different figures they refer to the same or similar objects.

DETAILED DESCRIPTION OF THE INVENTION

Reference is made to FIG. 1 showing schematically a cross-section through a thin-film photovoltaic device 10 according to the present invention. The solar cell 10 is supported on a substrate 12 which is typically glass of about 1 to 3 millimeters thickness. A back contact comprises a metal layer 14 deposited upon substrate 12. Layer 14, in the preferred embodiment, typically comprises or consists of molybdenum which has been deposited by sputtering to a thickness of about 0.2 to 2 microns. On top of the back electrode 14 a p-type CIS type semiconductor layer 16 (first layer) is arranged, having a thickness of about 0.2 to 2 microns.

The CIS layer 16 can be formed by any method available in the art. A preferred method includes sputter deposition of a sequence of layers comprising the metal constituents of the CIS layer, optionally depositing a Se layer by vapour deposition, followed by rapid thermal processing. A preferred process is described in J. Palm, V. Probst and F. H. Karg, "Second generation CIS solar modules" Solar Energy, vol. 77, p. 757-765, 2004, incorporated by reference.

Between the layers 12 and 14 a diffusion barrier layer (not shown) can be arranged, which serves to suppress diffusion of alkali metals from the glass substrate into the CIS layer 16. Further, the CIS layer preferably contains a controlled amount of Na, as disclosed in U.S. Pat. No. 5,626,688, included by reference.

In accordance with the invention, on top of the CIS layer of intrinsic ZnO 18 (second layer) is arranged by chemical vapour deposition. Intrinsic ZnO is also referred to as i-ZnO, high-resistivity ZnO, undoped ZnO. In the description and in the claims the expression 'intrinsic ZnO' is used to refer to a ZnO layer that has a bulk resistivity higher than 1 Ohm·cm, preferably higher than 100 Ohm·cm, such as between 1 and 10 times $10^3$ Ohm·cm. Preferably the layer is between 10 nm and 150 nm thick.

The solar cell 10 further comprises a n-type ZnO semiconductor layer 20 (third layer) in overlaying contact with the intrinsic ZnO layer 18, and preferably deposited by means of sputtering. Sputtering can for example be done by DC sputtering from an ZnO:Al target, or by reactive sputtering from a metallic target. The layer is appropriately doped to provide relatively low resistivity, for example, better than about 2.0 times $10^{-3}$ Ohm·cm, and preferably better than 1.0 times $10^{-3}$ Ohm·cm. The thickness of the layer 20 is suitably 0.5 to 2 microns.

In electrical connection with the n-type ZnO layer 20 front contacts 22 are arranged in the form of narrow metal strips which may be, for example, aluminium deposited by sputtering, evaporation, or plating. The module is further suitably encapsulated using known techniques, including for example laminating a tempered front glass using a transparent polymer sheet onto the front electrode side (not shown).

With reference to FIG. 2, there is illustrated a second embodiment 23 of the present invention in which there is an additional buffer layer 24 (fourth layer) sandwiched between the CIS layer 16 and the i-ZnO layer 18, and in direct contact with these layers. In a preferred embodiment the fourth layer consists of Zn(S,O,OH) which has been deposited by chemical bath deposition (CBD).

Such a layer can be deposited for example using a bath composition of 30 ... 100 mM $Zn(OAc)_2$, 2 ... 4 M ammonia and 0.3 ... 0.6 M thiourea, for example in a 5 ... 40 min deposition process at 70 ... 85° C. in a custom-made CBD-reactor. Optionally ultrasound can be applied during deposition.

With reference to FIGS. 1 and 2, a preferred method for depositing i-ZnO by chemical vapor deposition (CVD) will now be discussed.

CVD is a chemical process for depositing thin films of various materials. In a typical CVD process the substrate is exposed to one or more volatile precursors, which react and/or decompose on the substrate surface to produce the desired deposit.

The expression chemical vapour deposition is to include all variants of that technique, such as low temperature chemical vapor deposition (LTCVD). The substrate 12 with films 14, 16, and optionally 24, thereon is placed in a vacuum chamber on a heated support. The chamber is then evacuated and substrate temperature is adjusted to about 150 degree C. and allowed to stabilize for about 20 minutes. To form the i-ZnO zinc oxide layer 30 on a substrate having an area of about 30×30 cm, reactive gases comprising 8 sccm (standard cubic centimeters per minute) of diethyl zinc, 10 sccm $H_2O$, and 186 sccm of argon were flowed across the substrate at a pressure of 0.86 torr while the initial temperature was maintained. Flow rates of diethyl zinc and $H_2O$ were estimated from the flow rates of inert carrier gas streams, assuming saturation. For deposition times of from one to six minutes, i-ZnO films may be deposited to thicknesses ranging between 300 and 2000 angstroms. While the resulting ZnO film is referred to herein as pure, or essentially pure, ZnO, it will be appreciated that the $H_2O$ contributes some hydrogen to the material and this probably has some effect on resistivity.

While specific parameters are given above for a suitable example of a LTCVD process, good ZnO films can be achieved over a range of conditions. The substrate temperature can be varied from 60 degree C. to 350 degree C., and preferably from 100 degree C. to 200 degree C. Even at the 350 degree C. level, this is a low temperature process as compared to other methods of depositing transparent conductors and therefore is well suited for use with semiconductors. Vacuum system pressure can be varied from 10-250 Pa, which range is not considered high vacuum. The chamber should, however, preferably be capable of developing high vacuum levels to allow removal of all ambient gases from the chamber before deposition conditions are established. Other organozinc compounds having the formula $R_2Zn$, where R is a lower alkyl radical, for example dimethyl zinc $(CH_3)_2Zn$, may be used in place of the diethyl zinc $(C_2H_5)_2Zn$ specified above. Other oxygen sources, such as $O_2$ gas, may be useful in place of the $H_2O$ used in the preferred embodiment. Other inert gases, such as helium or possibly even nitrogen, could be used in place of argon as a carrier for the organozinc compound and water. The organozinc compound vapor and water vapor are preferably introduced into the vacuum chamber by bubbling the inert gas through a reservoir of the compound or deionized water. A mole ratio of water to organozinc compound greater than 1.0 is preferred to provide the proper reaction conditions.

Now a preferred method of deposition of the n-ZnO layer will be discussed.

Doped ZnO ceramic targets are used for sputtering, preferably Al-doped, more preferably 0.5-5% by weight. The substrate is heated to 150-250° C. prior to and during deposition. Preferably a dynamic sputter process is used, which means that the substrate is displaced relative to the target during deposition, such that material can be deposited on a surface much larger than the target. A typical dynamic sputter rate is 50-150 nm [film thickness]*(m/min) [substrate transportation velocity]. A typical sputter pressure is 0.1-1.0 Pa. A preferred sputter gas is Ar/O2 mixture with 0-10 vol-% $O_2$.

Discussion of Examples

Aspects of the invention will be now be discussed at the hand of a number of non-limiting examples. In the examples the intrinsic ZnO layer was deposited by either CVD (in accordance with the process of the invention such that thin-film photovoltaic devices according to the invention are obtained), or by RF sputtering. Further, solar cells according to the examples of FIG. 1 (without buffer layer) and FIG. 2 (with buffer layer) were produced and tested. The type of buffer layer was also varied. The other properties of the modules were kept constant, including the substrate (3 mm float glass with $Si_3N_4$ diffusion barrier), back electrode (450 nm sputtered Mo), absorber layer (2 μm CIGSS, Na doped), and the n-type DC sputtered ZnO. The tested modules were 30×30 $cm^2$ in size and encapsulated with a polymer resin and 3 mm front glass.

Unless otherwise specified, the modules were manufactured as disclosed in Solar Energy, vol. 77, p. 757-765, 2004.

The modules were subjected to a light-soaking treatment under standard one sun conditions (25 degrees C., air mass AM 1.5, 100 mW/$cm^2$), until an equilibrium was reached.

Then in each case the efficiency η [in %], the open circuit voltage $V_{oc}$ [mV], and the filling factor FF [%] were measured. In most cases a number of modules where tested and in these cases average values with standard deviations are reported.

Example 1

| buffer layer | i-ZnO | η [%] | $V_{oc}$ [mV] | $I_{sc}$ [mA/$cm^2$] | FF [%] |
|---|---|---|---|---|---|
| none | CVD | 11.3 | 559 | 32.9 | 61.3 |

The module of this example, according to the invention, did not contain a special buffer layer (fourth layer). The intrinsic ZnO layer of 70-80 nm thickness was deposited by metal-organic (MO)-CVD, generally as a LTCVD process described hereinbefore, with the following conditions: temperature of the heater 175-230° C., deposition pressure up to 700 mTorr, carrier gas nitrogen, precursors diethylzinc and water vapour, total massflow of carrier gas and vapors about 10 slm; resulting bulk resistivity 1.5-7 kOhm*cm. Finally a DC sputtered ZnO-front electrode was deposited.

Comparative Example 2

| buffer layer | i-ZnO | $\eta$ [%] | $V_{oc}$ [mV] | $I_{sc}$ [mA/cm$^2$] | FF [%] |
|---|---|---|---|---|---|
| none | RF sputtered | 7.9 ± 1.6 | 508 ± 18 | 28.0 ± 0.8 | 55.1 ± 7.4 |

In this comparative example, not according to the invention, the i-ZnO layer had been deposited by RF sputtering instead of by CVD in Example 1. This was the only difference. RF sputtering was carried out as follows: A 50-60 nm thick undoped ZnO thin film had been deposited from a ceramic target with a sputtering pressure between 1 and 5×10$^{-3}$ mbar Ar containing 0.5 vol-% O$_2$ and 5 vol-% H$_2$ at a substrate temperature of approximately 100° C.

Efficiency and other parameters are clearly improved in Example 1 according to the invention.

Example 3

| buffer layer | i-ZnO | $\eta$ [%] | $V_{oc}$ [mV] | $I_{sc}$ [mA/cm$^2$] | FF [%] |
|---|---|---|---|---|---|
| CdS | CVD | 11.5 ± 0.4 | 569 ± 9 | 32.8 ± 0.2 | 61.3 ± 1.8 |

The module of this example, according to the invention, did contain a CdS buffer layer (fourth layer). The CdS buffer layer was deposited by Chemical bath Deposition as follows: The bath consisted of 1.3 mM Cd(OAc)$_2$, 1.8 M NH$_3$, 0.12 M thiourea. The substrate with layers 14 and 16 was dipped in this bath at 60° C. for 12 min to produce a CdS layer on top of layer 16. Ultrasound was generated in the bath during deposition. Subsequent to deposition, samples rinsed in distilled water, followed by drying with nitrogen at 80° C. The i-ZnO layer was deposited as described for Example 1.

Comparative Example 4

| buffer layer | i-ZnO | $\eta$ [%] | $V_{oc}$ [mV] | $I_{sc}$ [mA/cm$^2$] | FF [%] |
|---|---|---|---|---|---|
| CdS | RF sputtered | 11.2 ± 0.6 | 553 ± 9 | 32.3 ± 0.2 | 62.5 ± 2.0 |

In this comparative example, not according to the invention, the i-ZnO layer had been deposited by RF sputtering instead of by CVD in Example 3. This was the only difference.

Electrical performance of CdS according to the invention is therefore found to be comparable to that obtained with conventional technology.

Example 5

| buffer layer | i-ZnO | $\eta$ [%] | $V_{oc}$ [mV] | $I_{sc}$ [mA/cm$^2$] | FF [%] |
|---|---|---|---|---|---|
| Zn (S, O, OH) | CVD | 11.6 ± 0.4 | 569 ± 15 | 33.4 ± 0.2 | 60.9 ± 1.7 |

The modules of this example, according to the invention, did contain a Zn(S,O,OH) buffer layer (fourth layer). The buffer layer was deposited in a chemical bath deposition process. The bath consisted of 30 mM Zn(OAc)$_2$, 2 M NH$_3$, 0.4 M thiourea. The substrate with layers 14 and 16 was dipped in this bath at 80° C. for 30 min to produce a Zn(S,O,OH) layer on top of layer 16. Ultrasound was generated in the bath during deposition. Subsequent to deposition, samples were first rinsed in 1 M NH$_3$, and then in distilled water. After drying with nitrogen at 80° C. samples were tempered for 15 min at 150° C. in vacuum furnace. The buffer layer was the only difference with regard to Examples 1 and 3.

Comparative Example 6

| buffer layer | i-ZnO | $\eta$ [%] | $V_{oc}$ [mV] | $I_{sc}$ [mA/cm$^2$] | FF [%] |
|---|---|---|---|---|---|
| Zn (S, O, OH) | RF sputtered | 9.1 ± 0.2 | 537 ± 10 | 31.9 ± 0.1 | 53.3 ± 1.1 |

In this comparative example, not according to the invention, the i-ZnO layer had been deposited by RF sputtering instead of by CVD in Example 5. This was the only difference.

The electrical performance of the Cd-free modules of Example 5, according to the invention, is again found to be much better than that of modules according to Comparative Example 6, and generally comparable with the results obtained from CdS containing modules in Examples 3 and 4.

Without wishing to be bound by a particular hypothesis, Applicant believes that the improved electrical performance of modules according to the invention as compared to those with RF-sputtered i-ZnO is due to the fact that CVD deposition is a milder treatment compared to sputtering, such that less unwanted effects take place at the interface with the layer below. Whereas CdS is a rather stable layer so that it can relatively well withstand sputtering conditions, the CIS type absorber layer or a Cd free buffer layer are more likely to be affected in a way that leads to decreased electrical performance of the module.

The modules of Examples 1, 3, 5 have a comparable damp heat stability to those of Comparative Examples 2, 4, 6, for example in a test at 85 degrees C. and 85% relative humidity, such as specified in the international standard IEC 61646.

That which is claimed is:
1. A process of making a thin-film photovoltaic device comprising the steps of:
 a) providing a first layer of a chalcopyrite semiconductor of a first doping type;

b) after step a), depositing a second layer of intrinsic zinc oxide by chemical vapor deposition by flowing gases over the first layer of chalcopyrite of step a) in a vacuum chamber, the gases comprising:
an organozinc compound of formula $R_2Zn$, where R is a lower alkyl radical;
water; and
an inert gas;
wherein the mole ratio of water to organozinc compound is greater than 1.0; and
wherein the flowing is performed:
at a temperature between 60° C. and 350° C.;
at a pressure between 10 to 250 Pa; and
for a time of between 1 and 6 minutes;
such that the second layer is deposited; and
c) after step b), depositing a third layer of zinc oxide semiconductor of a second doping type opposite to the first doping type by a method other than chemical vapor deposition.

2. The process according to claim 1, wherein the method other than chemical vapor deposition in step c) is sputtering.

3. The process according to claim 1, further comprising the step a1) between steps a) and b), of providing a fourth layer.

4. The process according to claim 3, wherein the fourth layer comprises a cadmium free metal and oxygen and/or sulfur.

5. The process according to claim 3, wherein the fourth layer is provided by chemical bath deposition.

6. The process according to claim 5, wherein the chemical bath deposition is carried out in a composition comprising 30 to 100 mM $Zn(OAc)_2$, 2 to 4 M ammonia and 0.3 to 0.6 M thiourea, for a time period of between 5 and 40 min at a temperature between 70 and 85° C.

7. The process according to claim 1, wherein the first layer is a p-type doped layer, and the third layer is a n-type doped layer.

8. A thin-film photovoltaic device obtained by the process according to claim 1, and comprising:
a first layer of a chalcopyrite semiconductor of a first doping type;
a second layer of intrinsic zinc oxide deposited by chemical vapor deposition;
a third layer of zinc oxide semiconductor of a second doping type opposite to the first doping type and deposited by a method other than chemical vapor deposition; and
wherein the second layer is arranged between the first and third layers.

9. The device according to claim 8, wherein the third layer is a sputter deposited layer.

10. The device according to claim 8, further comprising between the first and second layers a fourth layer.

11. The device according to claim 10, wherein the fourth layer comprises a cadmium free metal and oxygen and/or sulfur.

12. The device according to claim 8, wherein the second layer is in overlaying contact with the first layer.

13. The device according to claim 8, wherein the third layer is in overlaying contact with the second layer.

14. The process according to claim 2, further comprising the step a1) between steps a) and b), of providing a fourth layer.

15. The process according to claim 4, wherein the fourth layer is provided by chemical bath deposition.

16. The device according to claim 9, further comprising between the first and second layers a fourth layer.

17. The process according to claim 1, where in R is methyl or ethyl.

18. The process according to claim 1, wherein the organozinc compound and water are introduced into the vacuum chamber by bubbling the inert gas through a reservoir of the compound or deionized water.

19. The process according to claim 1, wherein the inert gas is argon, helium, or nitrogen.

20. The process according to claim 1, wherein the temperature is between 100° C. and 200° C.

21. The process according to claim 6, wherein the chemical bath deposition is carried out under ultrasound irradiation.

22. The process according to claim 4, wherein the cadmium free metal is selected from the group consisting of Zn, In, and Sn.

23. The process according to claim 3, wherein the fourth layer comprises a compound selected from the group consisting of $Zn(S,O,OH)$, $In_2S_3$, ZnSe, and $SnO_2$.

24. The process according to claim 11, wherein the cadmium free metal is selected from the group consisting of Zn, In, and Sn.

25. The process according to claim 10, wherein the fourth layer comprises a compound selected from the group consisting of $Zn(S,O,OH)$, $In_2S_3$, ZnSe, and $SnO_2$.

* * * * *

UNITED STATES PATENT AND TRADEMARK OFFICE
CERTIFICATE OF CORRECTION

PATENT NO. : 8,673,678 B2  Page 1 of 1
APPLICATION NO. : 12/097913
DATED : March 18, 2014
INVENTOR(S) : Niesen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1007 days.

Signed and Sealed this
Twenty-ninth Day of September, 2015

Michelle K. Lee
*Director of the United States Patent and Trademark Office*